(12) United States Patent
Chettimada et al.

(10) Patent No.: US 9,356,579 B2
(45) Date of Patent: May 31, 2016

(54) WAVEFORM GENERATION

(71) Applicant: NORDIC SEMICONDUCTOR ASA, Trondheim (NO)

(72) Inventors: Vinayak Kariappa Chettimada, Trondheim (NO); Glenn Ruben Bakke, Trondheim (NO); Bjorn Tore Taraldsen, Tiller (NO)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 0 days.

(21) Appl. No.: 14/374,864

(22) PCT Filed: Feb. 22, 2013

(86) PCT No.: PCT/GB2013/050436
§ 371 (c)(1),
(2) Date: Jul. 25, 2014

(87) PCT Pub. No.: WO2013/124667
PCT Pub. Date: Aug. 29, 2013

(65) Prior Publication Data
US 2015/0035571 A1      Feb. 5, 2015

(30) Foreign Application Priority Data
Feb. 22, 2012   (GB) .................................. 1203038.3

(51) Int. Cl.
*H03L 7/00*    (2006.01)
*H03K 3/012*   (2006.01)
*H03K 7/08*    (2006.01)
*H03K 3/64*    (2006.01)

(52) U.S. Cl.
CPC .................. *H03K 3/012* (2013.01); *H03K 3/64* (2013.01); *H03K 7/08* (2013.01)

(58) Field of Classification Search
CPC ........................................................ H03K 3/012
See application file for complete search history.

(56) References Cited

U.S. PATENT DOCUMENTS

| 6,433,584 B1 * | 8/2002 | Hatae ................. H03K 19/0016 326/38 |
| 2005/0280458 A1 | 12/2005 | Leung et al. |
| 2008/0100361 A1 | 5/2008 | Yee et al. |

FOREIGN PATENT DOCUMENTS

GB        2441572 A    3/2008

OTHER PUBLICATIONS

Form PCT/ISA/220 notification of transmittal of the international search report and written opinion of the international searching authority mailed Jul. 19, 2013, Form PCT/ISA/210 International Search Report, PCT/ISA/237 Written Opinion of the International Searching Authority for PCT/ GB2013/050436.
International Preliminary Report on Patentability (PCT/IB/373) for PCT/GB2013/050436 issued Aug. 26, 2014.

* cited by examiner
(Continued)

*Primary Examiner* — Daniel Puentes
(74) *Attorney, Agent, or Firm* — Koppel, Patrick, Heybl & Philpott

(57) ABSTRACT

A predetermined waveform is generated using a lower frequency clock signal (16) and a higher frequency clock signal (18). The waveform transitions between first and second states (12, 14) in synchrony with timing signals (18-1 to 18-11) of the higher frequency clock signal (18). The higher frequency clock is operated if the waveform will transition between the first and second states (12, 14) before the next timing signal (16-2) of the lower frequency clock. The higher frequency clock is powered down if the waveform will not transition between the first and second states (12, 14) before the next timing signal (16-3) of the lower frequency clock. The predetermined waveform can thus be generated having higher resolution but with lower power consumption.

28 Claims, 7 Drawing Sheets

WAVEFORM GENERATION

The present invention relates to a method of generating a predetermined waveform and a device for generating a predetermined waveform.

Waveforms such as digital signals or pulse wide modulation (PWM) signals can be used to transmit data or to provide control signals to electrical components. In some devices, a waveform can be generated by transitioning a signal, such as a voltage level, between states in synchrony with the timing signals of a clock for the device (e.g. in synchrony with timing signals provided by a crystal oscillator of the device).

In such devices, the time complexity or resolution of the generated waveform is dependent on the length of time between timing signals of the clock. A higher frequency clock (having shorter time periods between its timing signals) is able to provide a more time complex or higher resolution waveform than a lower frequency clock (having longer time periods between its timing signals). Thus, in situations where greater time complexity or higher resolution are desired, higher frequency clocks are generally desirable.

However, the Applicants have identified that devices which use higher frequency clocks may consume greater amounts of power than devices which use lower frequency clocks. This greater power consumption can, for example, be due to the fact that device operations which occur on each timing signal of the clock occur more frequently with higher frequency clocks than with a lower frequency clocks. Thus, in situations where lower power consumption is desired, lower frequency clocks are generally desirable.

The Applicants have accordingly identified that traditionally there was a balance to be struck between using higher frequency clocks to generate waveforms having greater time complexity and higher resolution and using lower frequency clocks for lower device power consumption.

It would, however, be desirable to provide a way in which to generate waveforms having greater time complexity and higher resolution without correspondingly increasing device power consumption.

The Applicants therefore believe that there remains scope for improvements in the way that waveforms are generated.

According to an aspect of the present invention there is provided a method of generating a predetermined waveform using a higher frequency clock and a lower frequency clock, the waveform transitioning between first and second states in synchrony with timing signals of the higher frequency clock, the method comprising:

operating the higher frequency clock if the waveform will transition between said states before the next timing signal of the lower frequency clock; and powering down the higher frequency clock if the waveform will not transition between said states before the next timing signal of the lower frequency clock.

This aspect of the invention extends to a device for generating a predetermined waveform using a higher frequency clock and a lower frequency clock, the device being configured to transition the waveform between first and second states in synchrony with timing signals of the higher frequency clock, the device further being configured to:

operate the higher frequency clock if the waveform will transition between said states before the next timing signal of the lower frequency clock; and power down the higher frequency clock if the waveform will not transition between said states before the next timing signal of the lower frequency clock.

The Applicants have accordingly identified a way in which to generate a predetermined waveform having greater time complexity and higher resolution but with reduced power consumption. In particular, by operating a higher frequency clock if the waveform will transition between the states before the next timing signal of a lower frequency clock, the predetermined waveform can be generated having a time complexity and resolution that is based on the higher frequency clock. However, by powering down the higher frequency clock if the waveform will not transition between the states before the next timing signal of a lower frequency clock, the predetermined waveform can be generated with reduced power consumption.

In one set of embodiments, the generated waveform forms part of a digital signal, wherein the first state comprises a first digital level (e.g. a "high" digital level) and the second state comprises a second digital level (e.g. a "low" digital level).

According to another aspect of the present invention there is provided a method of generating a predetermined waveform using a higher frequency clock and a lower frequency clock, the waveform transitioning between first and second states in synchrony with timing signals of the higher frequency clock, the method comprising:

operating the higher frequency clock if the waveform is in said first state; and powering down the higher frequency clock if the waveform will not transition from the second state to the first state before the next timing signal of the lower frequency clock.

This aspect of the invention extends to a device for generating a predetermined waveform using a higher frequency clock and a lower frequency clock, the device being configured to transition the waveform between first and second states in synchrony with timing signals of the higher frequency clock, the device further being configured to:

operate the higher frequency clock if the waveform is in said first state; and power down the higher frequency clock if the waveform will not transition from said second state to said first state before the next timing signal of the lower frequency clock.

As discussed above, the Applicants have identified a way in which to generate a predetermined waveform having greater time complexity and higher resolution but with reduced power consumption. Furthermore, in the above aspects, by operating the higher frequency clock if the waveform is in the first state, the higher frequency clock can be used to maintain the waveform in the first state.

In a set of embodiments the waveform comprises a pulse width modulation (PWM) signal, wherein the first state comprises the PWM signal being active (e.g. alternating between "low" and "high" digital levels) and the second state comprises the PWM signal being inactive (e.g. being fixed at a "low" or "high" digital level). The PWM signal, when active, may have any suitable frequency f but in a set of embodiments f is in the range 490 Hz-516 kHz. This range of frequencies may be used, for example, for motor (e.g. AC motor) control, lighting (e.g. LED) control and audio signals.

In embodiments of either aspect of the present invention, the waveform may be in the first state for a first time period ($t_{p1}$), with the first time period being defined in the device that generates the waveform by an integer number of timing signals of the higher frequency clock. For example, if the timing signals of the higher frequency clock are at 50 ms intervals and $t_{p1}$ is 0.5 seconds, then the first time period may be defined in the device by the number 10. Similarly, the waveform may be in the second state for a second time period ($t_{p2}$), with the second time period being defined in the device that generates the waveform by an integer number of timing signals of the higher frequency clock. For example, if the timing signals of the higher frequency clock are at 50 ms intervals and $t_{p2}$ is 1 second, then the second time period may be defined in the device by the number 20. As will be appreciated, $t_{p1}$ and $t_{p2}$ may be the same value or may be different values. These embodiments provide a simple but effective way to define the waveform.

In embodiments of the present invention, the first time period ($t_{p1}$) and second time period ($t_{p2}$) may also be equal in time to an integer number of timing signals of the lower frequency clock. This increases the likelihood of waveform state transitions being aligned with timing signals of the lower frequency clock.

In embodiments of the present invention, the waveform may be repeated a first number ($n_p$) of times so as to generate a train of pulses. Individual pulses or pulse trains may be repeated a second number ($n_t$) of times to generate a series of pulses or pulse trains. The start of the respective pulses or pulse trains may be separated by a third time period ($t_t$), with the third time period being defined in the device that generates the waveform by an integer number of timing signals of the higher frequency clock. For example, if the timing signals of the higher frequency clock are at 50 ms intervals and $t_t$ is 5 seconds, then the third time period may be defined in the device by the number 100. These embodiments again provide a simple but effective way to define a signal comprising the waveform.

In embodiments of the present invention, the third time period ($t_{p3}$) may also be equal to an integer number of timing signals of the lower frequency clock. This again increases the likelihood of waveform state transitions being aligned with timing signals of the lower frequency clock.

In embodiments of the present invention, any or all of the parameters f, $t_{p1}$, $t_{p2}$, $n_p$, $n_t$ and $t_t$ may be predetermined, and may be stored in or provided to the device that generates the waveform. The parameters may be provided to the device by an external host and may be reconfigurable either by the device that generates the waveform or by the external host. This allows for the waveform to be modified from time to time to provide various signals.

In embodiments of the present invention, the higher frequency clock may have a time period ($t_h$) between timing signals that is in the range 25-100 ms. For example, as discussed above, $t_h$ may be 50 ms. The lower frequency clock may have a time period ($t_l$) between timing signals that is in the range 0.5-2 seconds. For example, $t_l$ may be 1 second.

In embodiments of the present invention, the higher frequency clock may have a time period ($t_h$) between timing signals and the lower frequency clock may have a time period ($t_l$) between timing signals, where $t_l/t_h$ gives an integer value. This increases the likelihood of each timing signal of the lower frequency clock being aligned with a timing signal of the higher frequency clock.

In embodiments of the present invention, the higher frequency clock may have a lower relative and/or absolute timing signal precision and the lower frequency clock may have a higher relative and/or absolute timing signal precision. The higher precision of the lower frequency clock may help to compensate for any discrepancies (e.g. drift) between the timing signals of the higher and lower frequency clocks. Furthermore, the higher precision of the lower frequency clock (which may, for example, be provided externally to the device that generates the waveform), allows the higher frequency clock (which may, for example, be provided by a component that forms part of the device that generates the waveform) to be provide by a lower cost, lower power or less precise component.

The timing signals of the higher and lower frequency clocks may be provided in any desired and suitable way. In some embodiments, the higher frequency clock may be provided within the device that generates the waveform. For example, the higher frequency clock may be provided by a crystal oscillator for the device (e.g. that forms part of the device), by a synthesised clock source for the device (e.g. that forms part of the device) that synthesises the higher frequency clock from a crystal oscillator, or by an RC oscillator for the device (e.g. that forms part of the device). In some embodiments, the timing signals of the lower frequency clock may be provided externally to the device that generates the waveform. For example, the higher frequency clock may be provided by a radio interval. By powering down the higher frequency clock which forms part of the device, and by relying on a lower frequency clock which does not form part of the device, the device itself may consume less power.

In embodiments of the present invention, a state-change count may be associated with the waveform. The state-change count provides an indication of when to transition between states. For example, when the higher frequency clock is operated, the state-change count may be decremented on each timing signal of the higher frequency clock. When the state-change count reaches a predetermined minimum, the waveform may be made to transition between the first and second states.

In embodiments of the present invention, the state-change count may be set to a first number ($n_{p1}$) when transitioning the waveform to the first state, where $n_{p1}=t_{p1}/t_h$, and where $t_h$ is the time period between timing signals of the higher frequency clock. For example, if the timing signals of the higher frequency clock are at 50 ms intervals and $t_{p1}$ is 0.5 seconds, then $n_{p1}$ may be 10. Similarly, the state-change count may be set to a second number ($n_{p2}$) when transitioning the waveform to the second state where $n_{p2}=t_{p2}/t_h$. For example, if the timing signals of the higher frequency clock are at 50 ms intervals and $t_{p2}$ is 1 second, then $n_{p1}$ may be 20.

A power-save count may also be associated with the waveform. The power-save count provides an indication of when the next timing signal of the lower frequency clock will occur. For example, when the higher frequency clock is operated, the power-save count may be decremented on each timing signal of the higher frequency clock. However, when the higher frequency clock is powered down, in order for the state-change count to provide an indication of when to transition between states, the state-change count may be reduced by the power-save count.

In embodiments of the present invention, the power-save count may be set to an integer ($n_{ps}$) on each timing signal of the lower frequency clock, where $n_{ps}=t_l/t_h$, or (when $n_{ps}=t_l/t_h$ does not give an integer value) $n_{ps}=\text{floor}(t_l/t_h)$, and where $t_l$ is the time period between timing signals of the lower frequency clock. For example, if the timing signals of the higher frequency clock are at 50 ms intervals and the timing signals of the lower frequency clock are at 1 second intervals, then $n_{ps}$ may be 20.

In embodiments of the present invention, whether or not the waveform will transition between the first state and the second state before the next timing signal of the lower frequency clock may be determined from the state change count and the power-save count. For example, if the state-change count is greater than or equal to the power-save count then it may be determined that the waveform will not transition between the first state and the second state before the next timing signal of the lower frequency clock. Similarly, if the state-change count is less than the power-save count then it may be determined that the waveform will transition between the first state and the second state before the next timing signal of the lower frequency clock.

In embodiments of the present invention, the higher frequency clock may be re-synchronised with the lower frequency clock. This re-synchronisation may happen, for example, on the next timing signal of the lower frequency clock that occurs once the higher frequency clock is powered down and then is operated again. This can, for example, remove any drift in the higher frequency clock and allow waveform state transitions to occur in synchrony with timing signals of the lower frequency clock.

In embodiments of the present invention, when the waveform is initially generated, the device may be made to wait at least until the next timing signal of the lower frequency clock before being able to power down the high frequency clock. This can, for example, allow the relative temporal positions of the waveform state transitions and lower frequency clock timing signals to be determined before the high frequency clock may be powered down.

In embodiments of the present invention, if the higher frequency clock has previously been powered down and then is operated again, the device may be made to wait at least until the next timing signal of the lower frequency clock before initially generating the waveform. This can, for example, allow the higher and lower frequency clocks and the waveform state transitions to be synchronised when the waveform is initially generated.

As will be appreciated, the present invention has particular application to devices that would benefit from reduced power consumption such as battery or solar powered devices, although the present invention could equally apply to non-battery and non-solar powered devices.

Preferred embodiments of the present invention will now be described, by way of example only, with reference to the accompanying figures in which.

Figure 1:
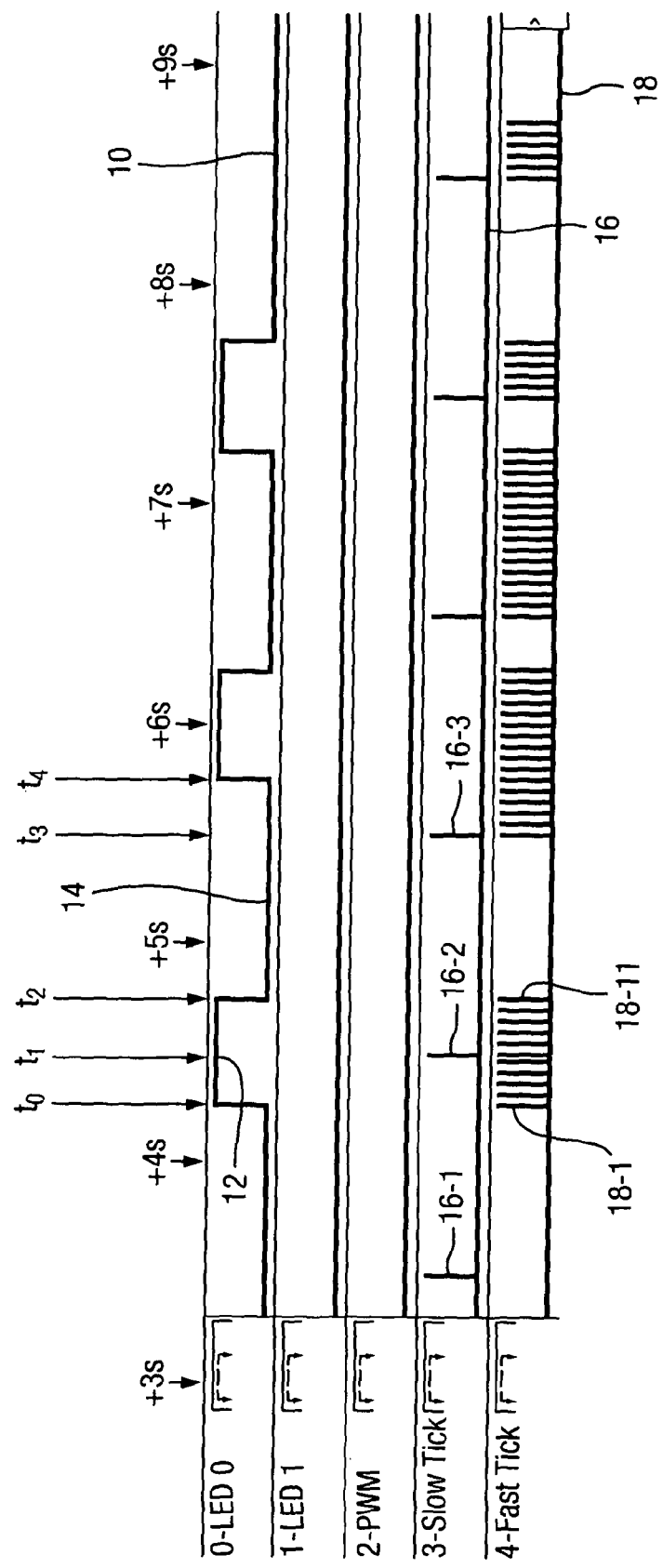
FIG. 1 shows a waveform generated in accordance with an embodiment of the present invention.

FIG. 1 shows a required waveform generated in accordance with an embodiment of the present invention. In this embodiment, the waveform forms part of a digital voltage signal 10 that is used to power an LED. The waveform has a first "high" state 12 and a second "low" state 14. The required waveform is in the first state 12 for a first time period $t_{p1}$ and in the second state 14 for a second time period $t_{p2}$. In this embodiment, the predetermined waveform required has $t_{p1}$=0.5 seconds and $t_{p2}$=one second. The digital signal 10 causes the LED to flash on for 0.5 seconds and turn off for one second.

FIG. 1 also shows a lower frequency clock signal 16 having timing signals 16-1 to 16-3. In this embodiment the lower frequency clock signal 16 runs at 1 Hz such that the leading edge of the timing signals 16-1 to 16-3 are spaced apart by one second. The time period between timing signals of the lower frequency clock shall be referred to herein as $t_l$. In this embodiment, the lower frequency clock signal 16 is provided externally to the device that generates the waveform. For example, the lower frequency clock signal 16 may be provided by a host device for the device that generates the waveform or by a radio interval.

FIG. 1 also shows a higher frequency clock signal 18 having timing signals 18-1 to 18-11. In this embodiment the higher frequency clock signal 18 runs at 20 Hz such that the leading edge of the timing signals 18-1 to 18-11 are generally spaced apart by 50 ms. However, the leading edges of timing signals 18-5 and 18-6 are spaced apart by slightly less than 50 ms since, as will be discussed in more detail below, timing signal 18-6 is re-synchronised with the timing signals of the lower frequency clock. The time period between timing signals of the higher frequency clock shall be referred to herein as $t_h$. In this embodiment, the higher frequency clock signal 20 is provided from within the device that generates the waveform. For example, the higher frequency clock may be provided by a crystal oscillator. In this embodiment, the lower frequency clock has a higher absolute precision than the higher frequency clock.

In embodiments of the present invention, the waveform has associated with it a power-save count which is reset on each timing signal of the lower frequency clock. The power-save count is reset to an integer $n_{ps}$ on each timing signal of the lower frequency clock. In this embodiment, $n_{ps}$ is given by:

$$n_{ps}=t_l/t_h.$$

In the present embodiment, $n_{ps}$ is:

$$n_{ps}=1\text{ second}/50\text{ ms}=20.$$

However, as will be appreciated, in embodiments in which $t_l/t_h$ does not give an integer value, the power-save count may be set to an integer $n_{ps}$, where:

$$n_{ps}=\text{floor}(t_l/t_h).$$

In the present embodiment, the power-save count is decremented by a predetermined amount (in this case one) on each timing signal of the higher frequency clock. The power-save count therefore provides a running indication of when the next timing signal of the lower frequency clock is due to occur. As will be appreciated, in this embodiment, the time until the next timing signal of the lower frequency clock can be taken to be:

$$\text{power-save count}\times t_h.$$

For example, if the power-save count is currently '20' then the time until the next timing signal of the lower frequency clock is assumed to be:

$$20\times50\text{ ms}=1\text{ second}.$$

The waveform also has associated with it a state-change count. As will be discussed in more detail below, the state-change count is either decremented on the higher frequency clock signal by a predetermined amount (in this case one) or reduced on the lower frequency clock signal (when the higher frequency clock is not in operation). When the state-change count reaches a predetermined minimum (in this case zero), the waveform is made to transition between states. The state-change count thereby provides a running indication of when to transition between states.

The state-change count is reset each time the waveform changes state. When transitioning to the first state, the state-change count is set to a first number ($n_{p1}$). In this embodiment, $n_{p1}$ is given by:

$$n_{p1}=t_{p1}/t_h.$$

In the present embodiment, $n_{p1}$ is:

$$n_{p1}=0.5\text{ seconds}/50\text{ ms}=10.$$

Similarly, when transitioning to the second state, the state-change count is set to a second number ($n_{p2}$). In this embodiment, $n_{p2}$ is given by:

$$n_{p2} = t_{p2}/t_h.$$

In the present embodiment, $n_{p2}$ is:

$$n_{p2} = 1 \text{ second}/50 \text{ ms} = 20.$$

As will be appreciated, in this embodiment, the time until state transition from the first state can be taken to be:

$$\text{state-change count} \times t_h.$$

For example, if the state-change count is currently 5 then the time until state transition is:

$$5 \times 50 \text{ ms} = 0.25 \text{ seconds}.$$

By comparing the state-change count to the power-save count, a determination can be made as to whether or not the waveform will transition between the first state 12 and the second state 14 before the next timing signal of the lower frequency clock.

In particular, if the state-change count is less than the power-save count, then the waveform will transition between states before the next timing signal of the lower frequency clock. In this situation, the higher frequency clock will imminently be needed to transition the waveform between states. In this situation, in order for the state-change count to provide an appropriate indication of exactly when to transition between states, the state-change count may be decremented by the predetermined amount (in this case one) on each timing signal of the higher frequency clock.

However, if the state-change count is greater than or equal to the power-save count, then the waveform will not transition between states before the next timing signal of the lower frequency clock. In this case, the higher frequency clock is not imminently needed to transition the waveform between states, and can be powered down at least until the next timing signal of the lower frequency clock. By powering down the higher frequency clock, the power consumption of the device that generates the waveform can be reduced.

When then the higher frequency clock is powered down, the state-change count is reduced, not by the predetermined amount (e.g. one), but by the power-save count on each timing signal of the lower frequency clock. In this way, the state-change count can still provide an appropriate indication of when to transition between states.

In order to give a better understanding of the above features, specific reference will now be made to the embodiment of FIG. 1.

Generation of the predetermined waveform begins at $t_0$. At this point in time, the waveform is placed in the first state 12 and the state-change count is accordingly set to '10' for that state in order to give the 0.5 seconds of "high" required at the beginning of the waveform. The higher frequency clock is operated at this point because there has not yet been a timing signal of the lower frequency clock during generation of the waveform. The state-change count is then decremented by one on each subsequent timing signal of the higher frequency clock.

At $t_1$, a timing signal 16-2 of the lower frequency clock is provided and the power-save count is accordingly reset to '20' (i.e. the ratio of the frequencies of the higher frequency and lower frequency clocks). The timing signal 16-2 of the lower frequency clock is also used to re-synchronise the higher and lower frequency clocks by aligning the timing signal 18-6 of the higher frequency clock with the timing signal 16-2 of the lower frequency clock. At this point in time, the state-change count has reached '5'. The higher frequency clock may now be powered down because there has been a timing signal of the lower frequency clock during generation of the waveform. However, the higher frequency clock remains in operation because the state-change count '5' is less than the power-save count '20'. The state-change count continues to be decremented by one on each timing signal of the higher frequency clock. The power-save count is also now decremented by one on each timing signal of the higher frequency clock.

At $t_2$, the state-change count reaches zero. The device places the waveform in the second state 14 and the state-change count is accordingly set to '20' for that state in order to give the one second of "low" dictated by the required waveform. At this point in time, the power-save count has reached '15'. The higher frequency clock is accordingly powered down because the power-save count '15' is now less than the state-change count '20', i.e. it is determined that the state of the waveform will not transition before the next timing signal of the lower frequency clock and therefore that the higher frequency clock is not imminently needed for a state transition. As there is no higher frequency clock between $t_2$ and $t_3$, the change count and power-save count are not decremented between $t_2$ and $t_3$.

At $t_3$, a timing signal 16-3 of the lower frequency clock is provided and the current state-change count '20' is reduced by the current power-save count '15' (as will be appreciated, the current power-save count at this point indicates how long the higher frequency clock has been powered down). Reducing the current state-change count '20' by the current power-save count '15' gives a state-change count of '5'. At this point in time, the power-save count is also reset to '20'. The higher frequency clock is also operated again because the state-change count '5' is now less than the power-save count '20', i.e. it is determined that the state of the waveform will transition before the next timing signal of the lower frequency clock and that the higher frequency clock is imminently needed for a state transition. The state-change count and power-save count are then decremented by one on each subsequent timing signal of the higher frequency clock.

At $t_4$, the state-change count reaches zero. The digital signal 10 transitions to the first state 12 and the state-change count is accordingly set to '10' for that state. At this point in time, the power-save count has reached '15'. The higher frequency clock accordingly remains in operation because the state-change count '10' is less than the power-save count '15'. The state-change count and power-save count continue to be decremented by one on each timing signal of the higher frequency clock.

As is shown in FIG. 1, the process continues so as to generate a digital signal 10 comprising a pulse train having a number ($n_p$) of pulses (in this case 3 pulses). In some embodiments (not illustrated by FIG. 1), the pulse train may be repeated a number ($n_r$) of times to give a set of pulse trains. The start of each pulse train may be separated from the next by a time period ($t_r$).

The above parameters ($t_{p1}$, $t_{p2}$, $n_p$, $n_r$ and/or $t_r$) are predetermined for the digital signal 10. For example, those parameters may be stored in a memory of the device that generates the waveform or may be provided to that device by an external host. Any of all of the above parameters may also be reconfigurable either by the device or by an external host.

Although the above embodiment has been described in the context of a voltage being applied to an LED, it will be appreciated that the waveform could equally be used to drive any other suitable component, such as an audio component (e.g. a buzzer or speaker) or a transmitter that is used to transmit control signals or data (e.g. a wireless transmitter).

Figure 2:
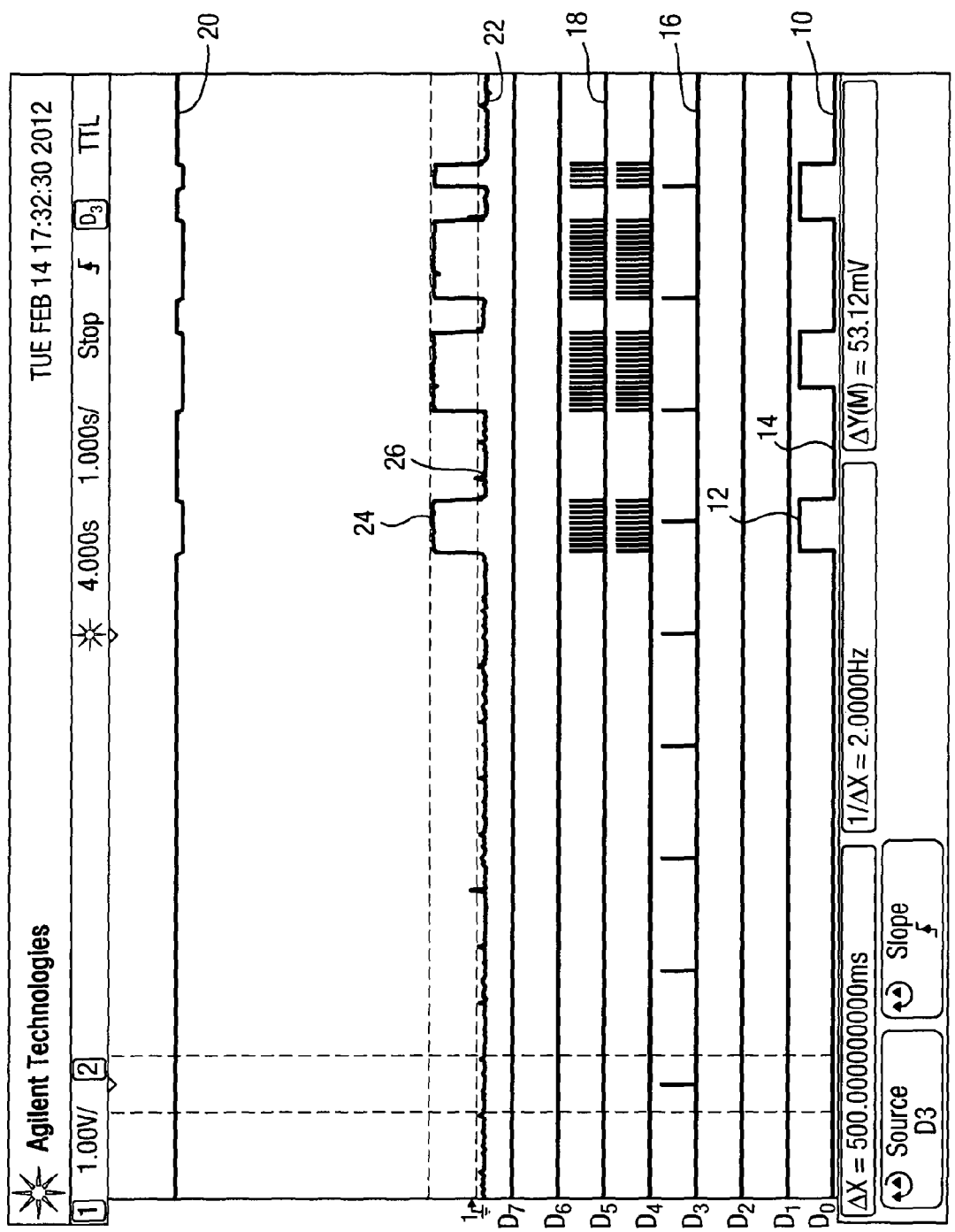
FIG. 2 shows the current drawn by a device that is used to generate the waveform of FIG. 1.

FIG. 2 shows the digital signal 10, the lower frequency clock signal 16 and the higher frequency clock signal 18 of FIG. 1. FIG. 2 also shows the voltage 20 that is used to operate the device that generates the waveform. FIG. 2 also shows the current 22 that is drawn by the device that generates the waveform. As is shown in FIG. 2, the current 22 is higher at times when the higher frequency clock is operated (indicated by 24) and is lower at times when the higher frequency clock is powered down (indicated by 26). Accordingly, the power that is consumed by the device that generates the waveform is reduced when the higher frequency clock is not operated. Embodiments of the present invention can therefore reduce the amount of power consumed by the device that generates the waveform.

Figure 3:
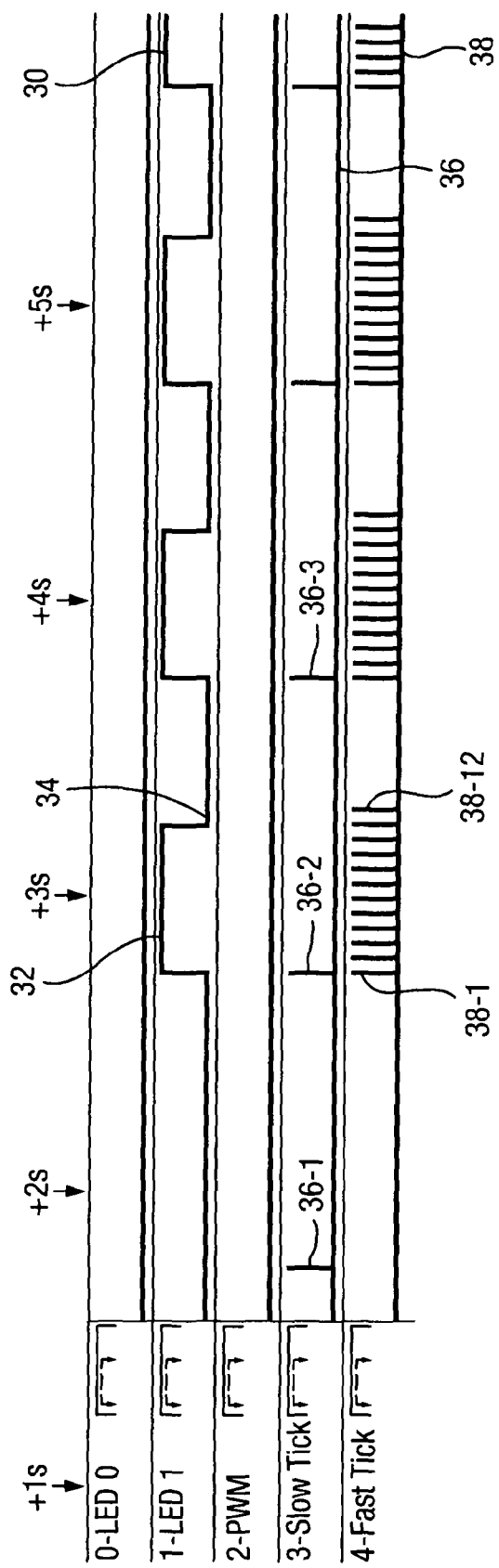
FIG. 3 shows a waveform generated in accordance with another embodiment of the present invention.

FIG. 3 shows a waveform generated in accordance with another embodiment of the present invention. The waveform of FIG. 3 is similar to that of FIGS. 1 and 2. Thus, the waveform again forms part of a digital signal 30, with the waveform having a first "high" state 32 and a second "low" state 34. However, in this embodiment, $t_{p1}$ is 0.5 seconds and $t_{p2}$ is 0.05 seconds giving a total complete waveform time of 0.55 seconds. Furthermore, in this embodiment, the waveform having the first "high" state 32 and second "low" state 34 are repeated a number ($n_t$) of times, with the start of each occurrence of the waveform being separated from the next by a time period ($t_t$). In this particular embodiment, $n_t$ is one second, giving a pulse every one second.

FIG. 3 also shows a lower frequency clock signal 36 having 1 Hz timing signals 36-1 to 36-5 and a higher frequency clock signal 38 having 20 Hz timing signals 38-1 to 36-12.

The waveform of this embodiment is generated in a similar manner to that of FIGS. 1 and 2. However, in this embodiment, the initial generation of the waveform is synchronised with a timing signal 36-2 of the lower frequency clock. Furthermore, the higher frequency clock is powered down after the waveform has been completed (after timing signal 38-12) and before the next iteration of the waveform. This allows the higher frequency clock to be powered down in-between iterations of a given waveform.

Figure 4:
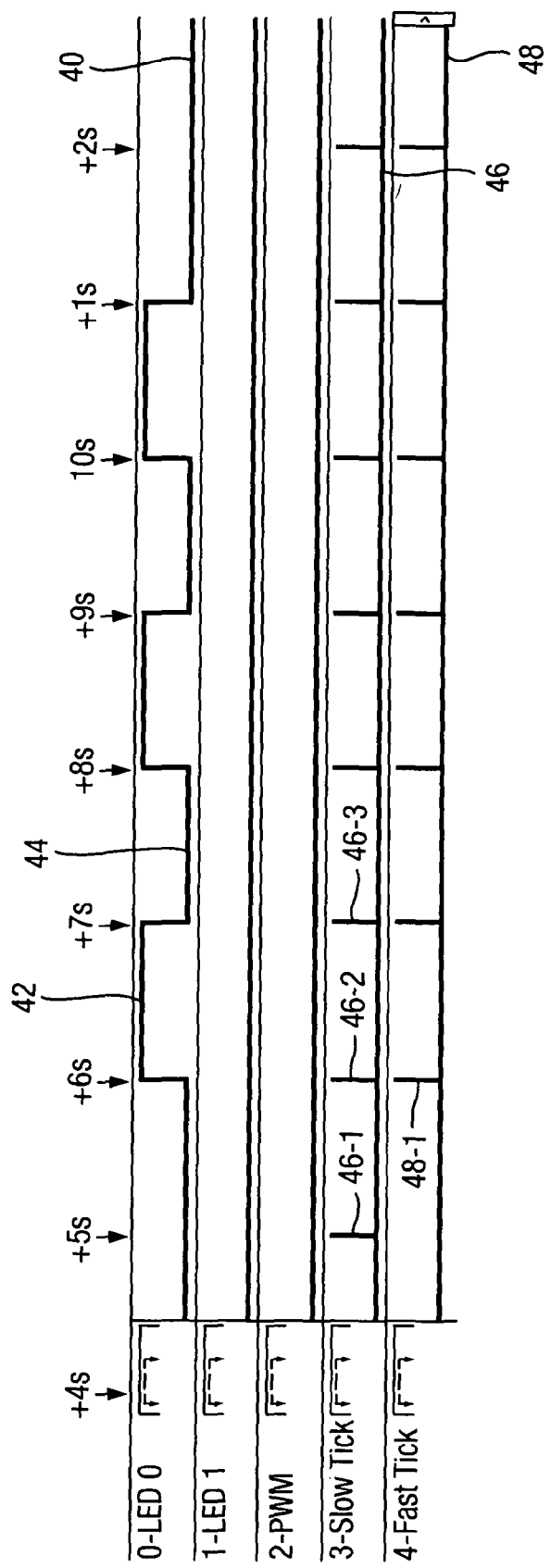
FIG. 4 shows a waveform generated in accordance with another embodiment of the present invention.

FIG. 4 shows a waveform generated in accordance with another embodiment of the present invention. The waveform of FIG. 4 is similar to that of FIGS. 1 2 and 3. Thus, the waveform again forms part of a digital signal 40, with the waveform having a first "high" state 42 and a second "low" state 44. However, in this embodiment, $t_{p1}$ is 1 second and $t_{p2}$ is one second.

FIG. 4 also shows a lower frequency clock signal 46 having 1 Hz timing signals 46-1 to 46-3 and a higher frequency clock signal 48 having a timing signal 48-1.

The waveform of this embodiment is generated in a similar manner to that of FIGS. 1, 2 and 3. However, due to the time parameters of the waveform, only one higher frequency clock signal 48-1 is needed for each waveform pulse. This embodiment illustrates the maximum amount of power saving that can be achieved with embodiments of the present invention.

Figure 5:
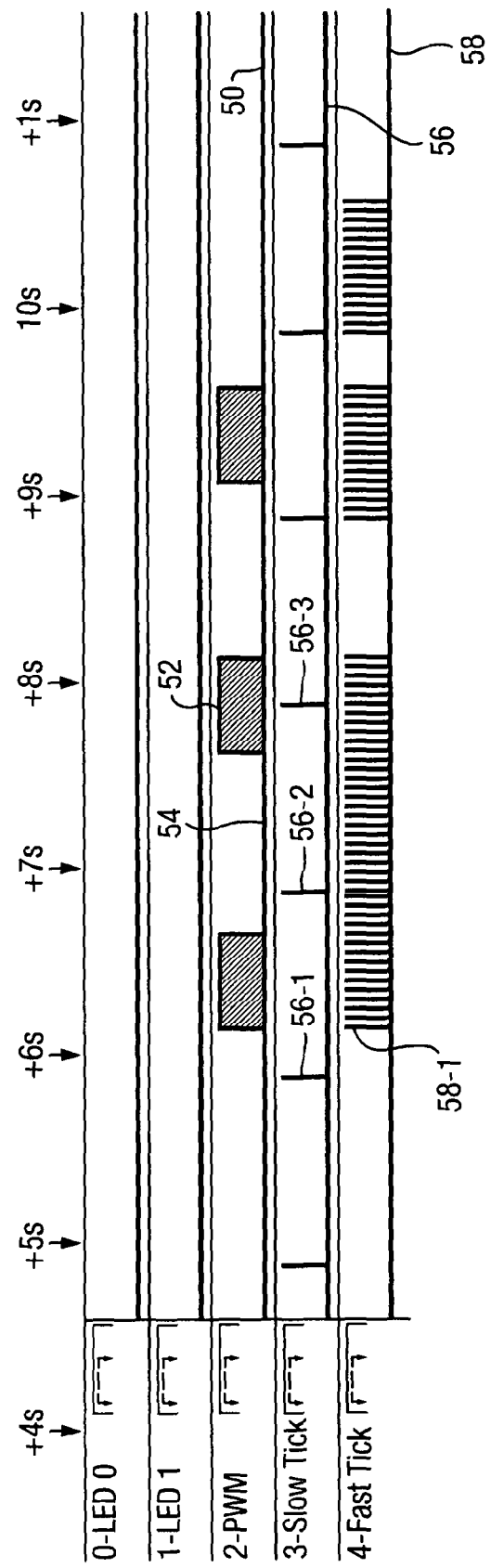
FIG. 5 shows a waveform generated in accordance with another embodiment of the present invention.

FIG. 5 shows a waveform generated in accordance with another embodiment of the present invention. In this embodiment, the waveform comprises a PWM signal 50, with the waveform having a first state 52 in which the PWM signal is active and a second state 54 in which the PWM signal is inactive. The frequency f of the active PWM signal in this particular embodiment, shown in solid black due to the scale of FIG. 5, is 5 kHz. As with the previous embodiments, the waveform is in the first state 52 for a first time period $t_{p1}$ and in the second state 54 for a second time period $t_{p2}$ In this embodiment, $t_{p1}$ is 0.5 seconds and $t_{p2}$ is 1 second.

FIG. 5 also shows a lower frequency clock signal 56 having 1 Hz timing signals 56-1 to 56-3 and a higher frequency clock signal 58 having timing signals starting at timing signal 58-1.

The waveform of this embodiment is generated in a similar manner to that of FIGS. 1 and 2. Thus, whilst the waveform is in the second state 54, the higher frequency clock is powered down if the state-change count is greater than or equal to the power-save count, i.e. if it is determined that the waveform will not transition from the second state 54 to the first state 52 before the next timing signal of the lower frequency count.

However, whilst the waveform is in the first state 52, the higher frequency clock remains in operation even if the state-change count is greater than or equal to the power-save count, i.e. even if it is determined that the waveform will not transition from the first state 52 to the first state 54 before the next timing signal of the lower frequency count. This allows, for example, the higher frequency clock to be used to provide the active PWM signal.

Figure 6:
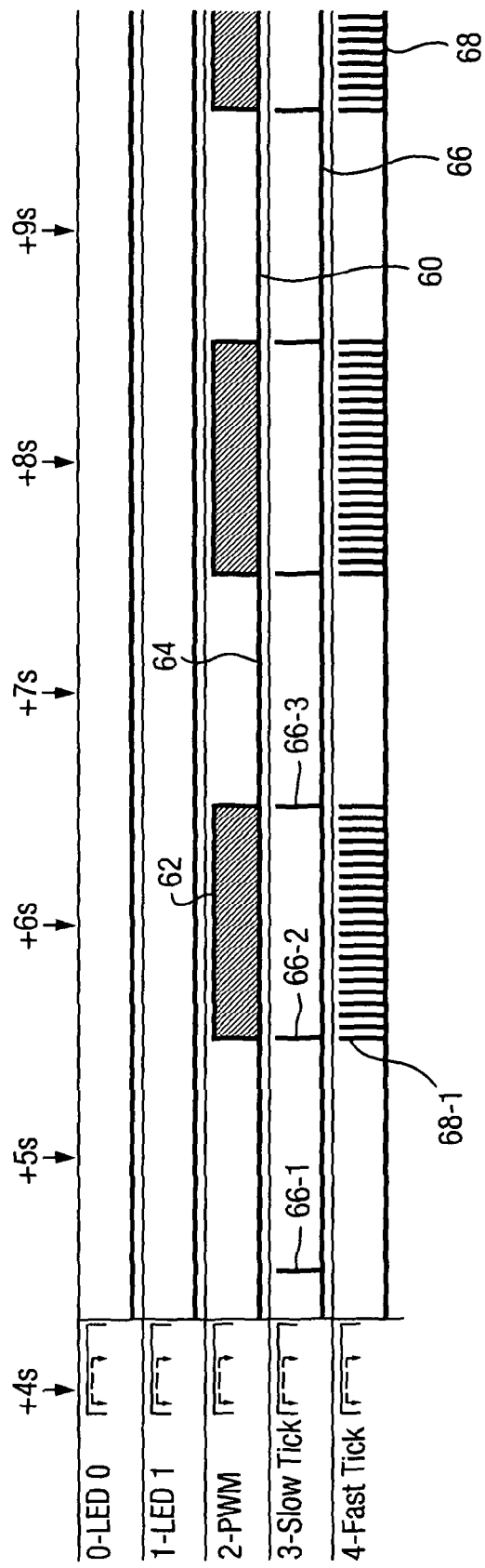
FIG. 6 shows a waveform generated in accordance with another embodiment of the present invention.

This alternative arrangement for operating the higher frequency clock when in the first state is better illustrated in FIG. 6. In this embodiment, the waveform again comprises a PWM signal 60, with the waveform having a first state 62 in which the PWM signal is active and a second state 64 in which the PWM signal is inactive.

FIG. 6 also shows a lower frequency clock signal 66 having 1 Hz timing signals 66-1 to 66-3 and a higher frequency clock signal 68 having timing signals starting at timing signal 68-1.

In this embodiment, $t_{p1}$ is 1 second and $t_{p2}$ is 1 second and the initial generation of the waveform is synchronised with a timing signal 66-2 of the lower frequency clock. The parameters of the waveform in this embodiment are therefore similar to those of the embodiment of FIG. 4 described above. However, unlike the embodiment of FIG. 4, FIG. 6 shows that the higher frequency clock remains in operation whilst the waveform is in the first state 62 so as to provide the active PWM signal.

Figure 7:
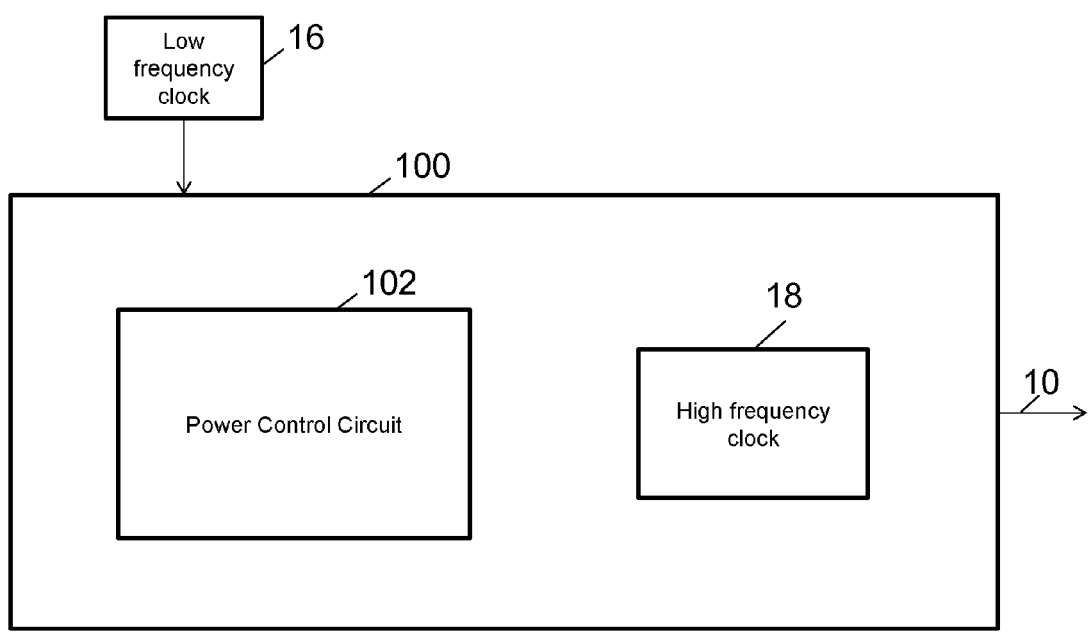
FIG. 7 shows a block diagram of a waveform generation device in accordance with an embodiment of the present invention.

FIG 7 shows a block diagram of a waveform generation device 100 in accordance with an embodiment of the present invention. The device 100 comprises a power control circuit 102 and a high frequency clock 18. The device 10 is also arranged to receive an external, low frequency clock 16 which may be provided by a separate host device or by a radio interval. The device 100 transitions a waveform 10 between states using timing signals from the clocks 16, 18 in accordance with the methods described below with reference to FIGS. 1 to 6. The power control circuit 102 controls whether the high frequency clock 18 is operating or powered down as described in further detail below.

Although preferred embodiments of the present invention have been described, it will be apparent to the skilled person that various features of those embodiments can be altered, removed or substituted without departing from the scope of the invention as defined by the appended claims.

The invention claimed is:

1. A method of generating a predetermined waveform using a higher frequency clock and a lower frequency clock, the waveform transitioning between first and second states in synchrony with timing signals of the higher frequency clock, the method comprising:
    using a power control circuit to operate the higher frequency clock if the waveform will transition between said states before the next timing signal of the lower frequency clock; and using the power control circuit to power down the higher frequency clock if the waveform will not transition between said states before the next timing signal of the lower frequency clock.

2. A method as claimed in claim 1, wherein:
the waveform forms part of a digital signal;
the first state comprises a first digital level; and
the second state comprises a second digital level.

3. A method as claimed in claim 1, wherein:
the waveform is in the first state for a first time period ($t_{p1}$), the first time period being defined in the device that generates the waveform by an integer number of timing signals of the higher frequency clock; and/or
the waveform is in the second state for a second time period ($t_{p2}$), the second time period being defined in the device that generates the waveform by an integer number of timing signals of the higher frequency clock.

4. A method as claimed in claim 1, wherein the waveform is in the first state for a first time period ($t_{p1}$), the first time period being equal in time to an integer number of timing signals of the lower frequency clock.

5. A method as claimed in claim 1, wherein:
the waveform is repeated a number ($n_p$) of times to generate a pulse train.

6. A method as claimed in claim 5, wherein:
the pulse train is repeated a number ($n_t$) of times to generate a series of pulse trains.

7. A method as claimed in claim 6, wherein:
the start of the respective pulse trains are separated by a third time period ($t_t$), the third time period being defined in the device that generates the waveform by an integer number of timing signals of the higher frequency clock.

8. A method as claimed in claim 1, wherein:
the higher frequency clock has a time period ($t_h$) between timing signals, wherein $t_h$ is in the range 25-100 ms, and is preferably 50 ms; and
the lower frequency clock has a time period ($t_l$) between timing signals, wherein $t_l$ is in the range 0.5-2 seconds, and is preferably 1 second.

9. A method as claimed in claim 1, wherein:
the higher frequency clock has a lower relative and/or absolute timing signal precision; and
the lower frequency clock has a higher relative and/or absolute timing signal precision.

10. A method as claimed in claim 1, wherein:
the timing signals of the higher frequency clock are provided by a crystal oscillator.

11. A method as claimed in claim 1, wherein:
the timing signals of the lower frequency clock are provided by a radio interval and/or are provided by a host that is external to a device that generates the waveform.

12. A method as claimed in claim 1, wherein:
a state-change count is associated with the waveform, the state-change count providing an indication of when to transition between states; and/or
a power-save count is associated with the waveform, the power-save count providing an indication of when the next timing signal of the lower frequency clock will occur.

13. A method as claimed in claim 12, comprising:
when the higher frequency clock is operated, decrementing the state-change count on each timing signal of the higher frequency clock.

14. A method as claimed in claim 12, comprising:
when the higher frequency clock is operated, decrementing the power-save count on each timing signal of the higher frequency clock.

15. A method as claimed in claim 12, comprising:
when the higher frequency clock is powered down, reducing the state-change count by the power-save count.

16. A method as claimed in claim 12, comprising:
when the state-change count reaches a predetermined minimum, transitioning the waveform between the first and second states.

17. A method as claimed in claim 12, comprising:
setting the state-change count to a first number ($n_{p1}$) when transitioning the waveform to the first state, where:

$$n_{p1} = t_{p1}/t_h;$$

where $t_h$ is the time period between timing signals of the higher frequency clock and $t_{p1}$ is the time period during which the waveform is in the first state; and/or
setting the state-change count to a second number ($n_{p2}$) when transitioning the waveform to the second state, where:

$$n_{p2} = t_{p2}/t_h;$$

where $t_h$ is the time period between timing signals of the higher frequency clock and $t_{p2}$ is the time period during which the waveform is in the second state.

18. A method as claimed in claim 12, comprising:
setting the power-save count to an integer ($n_{ps}$) on each timing signal of the lower frequency clock, where:

$$n_{ps} = t_l/t_h, \text{ and/or}$$

$$n_{ps} = \text{floor}(t_l/t_h);$$

where $t_h$ is the time period between timing signals of the higher frequency clock and $t_l$ is the time period between timing signals of the lower frequency clock.

19. A method as claimed in claim 12, comprising:
determining that the waveform will not transition between the first state and the second state before the next timing signal of the lower frequency clock if the state-change count is greater than or equal to the power-save count; and/or
determining that the waveform will transition between the first state and the second state before the next timing signal of the lower frequency clock if the state-change count is less than the power-save count.

20. A method as claimed in claim 1, comprising:
if the higher frequency clock has previously been powered down and then is operated again, waiting at least until the next timing signal of the lower frequency clock before initially generating the waveform.

21. A method as claimed in claim 1, wherein:
the waveform is generated by a battery and/or solar powered device.

22. A device for generating a predetermined waveform using a higher frequency clock and a lower frequency clock, the device comprising a power control circuit and being configured to transition the waveform between first and second states in synchrony with timing signals of the higher frequency clock, the device further being configured to:
use the power control circuit to operate the higher frequency clock if the waveform will transition between said states before the next timing signal of the lower frequency clock; and
use the power control circuit to power down the higher frequency clock if the waveform will not transition between said states before the next timing signal of the lower frequency clock.

23. A method as claimed in claim 1, wherein the waveform is in the second state for a second time period ($t_{p2}$), the second time period being equal in time to an integer number of timing signals of the lower frequency clock.

24. A method of generating a predetermined waveform using a higher frequency clock and a lower frequency clock, the waveform transitioning between first and second states in synchrony with timing signals of the higher frequency clock, the method comprising:
   using a power control circuit to operate the higher frequency clock if the waveform is in said first state; and
   using the power control circuit to power down the higher frequency clock if the waveform will not transition from said second state to said first state before the next timing signal of the lower frequency clock.

25. A method as claimed in claim 24, wherein:
   the waveform comprises a pulse width modulation (PWM) signal;
   the first state comprises the PWM signal being active; and
   the second state comprises the PWM signal being inactive.

26. A method as claimed in claim 25, wherein:
   the PWM signal has a frequency f in the range 490 Hz-516 kHz.

27. A method as claimed in claim 26, wherein:
   f, $t_{p1}$, $t_{p2}$, $n_p$, $n_t$ and/or $t_t$ are reconfigurable parameters defined in a device that generates the waveform.

28. A device for generating a predetermined waveform using a higher frequency clock and a lower frequency clock, the device comprising a power control circuit and being configured to transition the waveform between first and second states in synchrony with timing signals of the higher frequency clock, the device further being configured to:
   use the power control circuit to operate the higher frequency clock if the waveform is in said first state; and
   use the power control circuit to power down the higher frequency clock if the waveform will not transition from said second state to said first state before the next timing signal of the lower frequency clock.

* * * * *